United States Patent
Kim et al.

(10) Patent No.: US 10,510,672 B2
(45) Date of Patent: Dec. 17, 2019

(54) SEMICONDUCTOR PACKAGES AND METHODS OF MANUFACTURING SAME

(71) Applicant: Samsung Electronics Co., Ltd., Suwon-si (KR)

(72) Inventors: Sang-Uk Kim, Cheonan-si (KR); Sunchul Kim, Asan-si (KR); Jinkyeong Seol, Cheonan-si (KR); Byoung Wook Jang, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/956,414

(22) Filed: Apr. 18, 2018

(65) Prior Publication Data

US 2019/0019758 A1 Jan. 17, 2019

(30) Foreign Application Priority Data

Jul. 17, 2017 (KR) ........................ 10-2017-0090453

(51) Int. Cl.
*H01L 23/538* (2006.01)
*H01L 21/56* (2006.01)
(Continued)

(52) U.S. Cl.
CPC ...... *H01L 23/5389* (2013.01); *H01L 21/4853* (2013.01); *H01L 21/561* (2013.01);
(Continued)

(58) Field of Classification Search
CPC . H01L 23/5389; H01L 21/561; H01L 21/563; H01L 21/4853; H01L 25/50;
(Continued)

(56) References Cited

U.S. PATENT DOCUMENTS 7,777,351 B1 8/2010 Berry et al.
7,989,707 B2 8/2011 Yamano et al.
(Continued)

FOREIGN PATENT DOCUMENTS

KR 10-1469799 B1 12/2014

*Primary Examiner* — Sonya D. McCall-Shepard
(74) *Attorney, Agent, or Firm* — Muir Patent Law, PLLC

(57) ABSTRACT

A semiconductor package and a method manufacturing the same are disclosed. At least one semiconductor chip is mounted on a package substrate. An insulative mold layer is formed at sides of the semiconductor chip having at least one recess in a region in which conductive connection members are formed, the recess defining one or more protrusions within the mold layer. An interposer is positioned on the protrusions with the conductive connection members connecting and providing electrical connections between conductive pads on the upper surface of the package and conductive pads on the lower surface of the package substrate. The protrusions may position the interposer in the vertical direction by defining the vertical spacing between the lower surface of the interposer and the upper surface of the package substrate. The protrusions may also position the interposer in one or more horizontal directions and/or prevent substantial movement during connecting of the interposer to the package substrate. An under-fill resin layer may be injected into remaining space between the interposer and the package substrate.

20 Claims, 19 Drawing Sheets

(51) Int. Cl.
  *H01L 21/48* (2006.01)
  *H01L 25/00* (2006.01)
  *H01L 25/10* (2006.01)
  *H01L 23/00* (2006.01)
  *H01L 23/31* (2006.01)

(52) U.S. Cl.
  CPC ........ *H01L 21/563* (2013.01); *H01L 23/3121* (2013.01); *H01L 23/3185* (2013.01); *H01L 23/5385* (2013.01); *H01L 23/5386* (2013.01); *H01L 24/19* (2013.01); *H01L 24/20* (2013.01); *H01L 24/97* (2013.01); *H01L 25/105* (2013.01); *H01L 25/50* (2013.01); *H01L 23/3128* (2013.01); *H01L 2224/214* (2013.01); *H01L 2224/97* (2013.01); *H01L 2225/1035* (2013.01); *H01L 2225/1041* (2013.01)

(58) Field of Classification Search
  CPC ....... H01L 25/105; H01L 24/97; H01L 24/20; H01L 24/19; H01L 23/5386; H01L 23/5385; H01L 23/3185; H01L 23/3121; H01L 23/3128; H01L 2225/1041; H01L 2225/1035; H01L 2224/214
  See application file for complete search history.

(56) References Cited

U.S. PATENT DOCUMENTS

| | | | |
|---|---|---|---|
| 7,994,626 | B2 | 8/2011 | Pendse |
| 8,076,765 | B2 | 12/2011 | Chen et al. |
| 8,217,502 | B2 | 7/2012 | Ko |
| 8,247,894 | B2 | 8/2012 | Yoon et al. |
| 8,541,261 | B2 | 9/2013 | Kikuchi et al. |
| 8,793,868 | B2 | 8/2014 | Yamano et al. |
| 8,810,024 | B2 | 8/2014 | Lin et al. |
| 9,343,386 | B2 | 5/2016 | Huang et al. |
| 9,343,535 | B2 | 5/2016 | Lee et al. |
| 9,570,382 | B2 | 2/2017 | Haba |
| 9,666,571 | B2 | 5/2017 | Kao et al. |
| 2008/0017968 | A1 | 1/2008 | Choi et al. |
| 2012/0306075 | A1 | 12/2012 | Kim et al. |
| 2014/0117506 | A1* | 5/2014 | Hong ............ H01L 24/97 257/621 |
| 2014/0346667 | A1 | 11/2014 | Han et al. |
| 2015/0084170 | A1* | 3/2015 | Im ............ H01L 23/3677 257/675 |
| 2015/0287681 | A1 | 10/2015 | Soh et al. |
| 2016/0027764 | A1 | 1/2016 | Kim et al. |
| 2016/0118369 | A1 | 4/2016 | Yew et al. |
| 2017/0154878 | A1 | 6/2017 | Kim et al. |

* cited by examiner

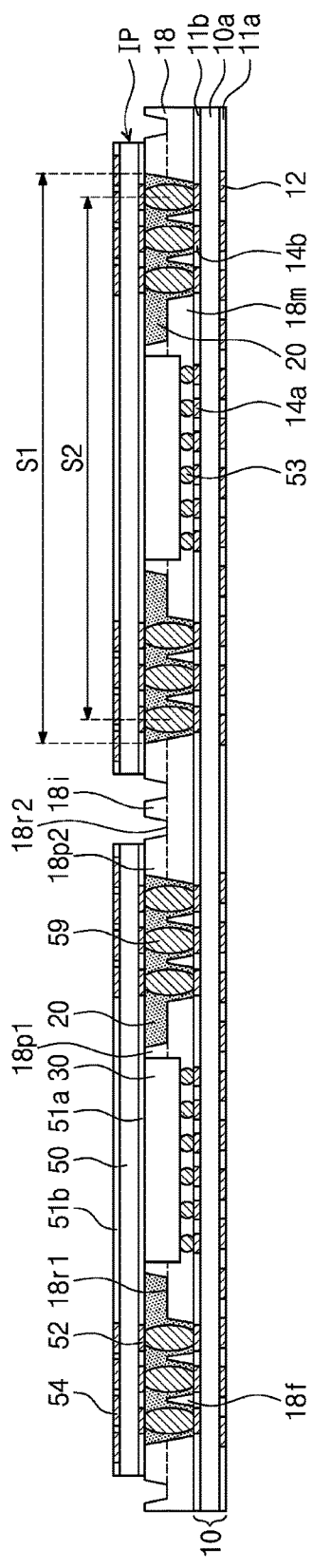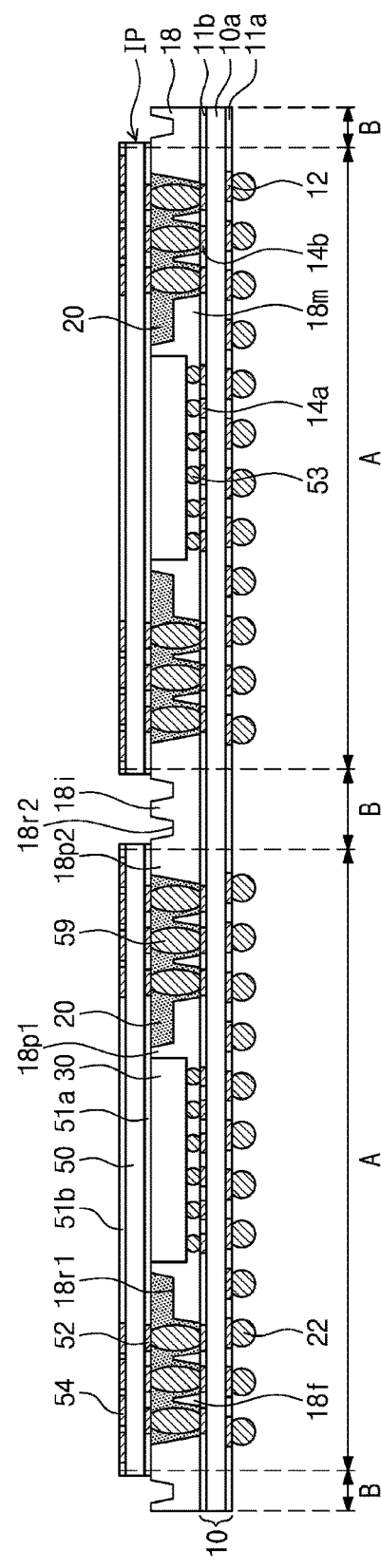

SEMICONDUCTOR PACKAGES AND METHODS OF MANUFACTURING SAME

CROSS-REFERENCE TO RELATED APPLICATIONS

This U.S. nonprovisional patent application claims priority under 35 U.S.C § 119 of Korean Patent Application No. 10-2017-0090453 filed on Jul. 17, 2017 entire contents of which are hereby incorporated by reference.

BACKGROUND

With the development of electronic industry, electronic products have increasingly demanded for high performance, high speed, and compact size. To cope with this trend, there have been developed numerous stacking methods such as stacking a plurality of semiconductor chips on a single substrate or stacking a package on another package. A structure where packages are stacked on one another is called Package-On-Package (POP). There is also an interposer POP structure where an interposer is mounted on a package.

SUMMARY

Embodiments set forth herein are directed to semiconductor packages and methods of manufacturing a semiconductor package. According to some examples, a method of manufacturing a semiconductor package comprises attaching a plurality of first conductive bumps to respective first conductive pads provided on an upper surface of a first substrate; providing an interposer with a plurality of second conductive bumps attached to respective second conductive pads on a bottom surface of the interposer; flip chip mounting a first semiconductor chip to the first substrate including electrically connecting the first semiconductor chip to third conductive pads provided on the upper surface of the first substrate; forming an insulative mold layer on the upper surface of the first substrate, the insulative mold layer extending along sidewalls of the first semiconductor chip and having an upper surface at least as high as an upper surface of the first semiconductor chip, the insulative mold layer having a recess formed in its upper surface, sides of the recess corresponding to sides of upwardly extending protrusions of the mold layer, wherein the first conductive bumps are exposed with respect to the insulative mold layer at a bottom surface of the recess; placing the interposer on the first substrate so that each of the plurality of second conductive bumps on the bottom surface of the interposer are in contact with a corresponding one of the plurality of first conductive bumps to provide a plurality of contacting pairs of first conductive bumps and second conductive bumps, and so that the bottom surface of the interposer is in contact with upper surfaces of the protrusions; performing a reflow process to merge each of the contacting pairs of the first conductive bumps and the second conductive bumps to form a plurality of conductive connection members, each conductive connection member extending between a corresponding first conductive pad on the upper surface of the first substrate and a corresponding second conductive pad on the bottom surface of the interposer; flowing an under-fill resin in a space between the interposer and the first substrate to surround and encapsulate the conductive connection members; and cutting the first substrate to form the semiconductor package, the semiconductor package including the first semiconductor chip and at least portions of the protrusions in contact with the interposer.

In some examples, the insulative mold layer may be formed on the upper surface of the first substrate to cover and surround the first conductive bumps, and then the mold layer may be etched to provide the recess in the mold layer, to define upwardly extending protrusions and to expose the first conductive bumps.

According to some examples, a semiconductor package comprises a package substrate comprising first conductive pads and third conductive pads on an upper surface thereof; an interposer having second conductive pads on a bottom surface thereof; a first semiconductor chip flip chip mounted to the upper surface of the first substrate, the first semiconductor chip being electrically connected to the third conductive pads on the upper surface of the first substrate; an insulative mold layer extending between the upper surface of the first substrate and the bottom surface of the interposer, the insulative mold layer including portions extending along sidewalls of the first semiconductor chip and having an upper surface at least as high as an upper surface of the first semiconductor chip, the insulative mold layer including a recess to define upwardly extending protrusions in the mold layer, the upwardly extending protrusions being in contact with the bottom surface of the interposer, and the insulative mold layer including a plurality of holes in a bottom surface of the recess; a plurality of conductive connection members, each conductive connection member extending between and electrically connecting a corresponding first conductive pad on the upper surface of the first substrate and a corresponding second conductive pad on the bottom surface of the interposer, and each conductive connection member being located within a corresponding hole; and an under-fill resin filling the recess between the interposer and the first substrate surrounding the conductive connection members.

The protrusions may be formed to have a spacing that correlates to spacings of the second conductive bumps on the bottom surface of the interposer to guide the interposer when connecting the interposer to the package substrate. Conductive connection members may similarly be positioned to correlate to spacings of the protrusions. Further improvements will be appreciated by reference to the following detailed description.

BRIEF DESCRIPTION OF THE DRAWINGS

FIGS. 9 to 12, 13A, 13B, 14, and 15 illustrate cross-sectional views showing a method of manufacturing a semiconductor package of FIGS. 1 to 5.

DETAILED DESCRIPTION OF EMBODIMENTS

Hereinafter, exemplary embodiments of the present inventive concepts will be described in detail in conjunction with the accompanying drawings to aid in clearly understanding the present inventive concepts. It should be understood that ordinal numbers such as "first," "second," "third," etc. are typically used simply as labels of certain elements, steps, etc., to distinguish such elements, steps, etc. from one another. Terms that are not described using "first," "second," etc., in the specification, may still be referred to as "first" or "second" in the claims. In addition, a term that is referenced with a particular ordinal number (e.g., "first" in a particular claim) may be described elsewhere with a different ordinal number (e.g., "second" in the specification or another claim). Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Figure 1:
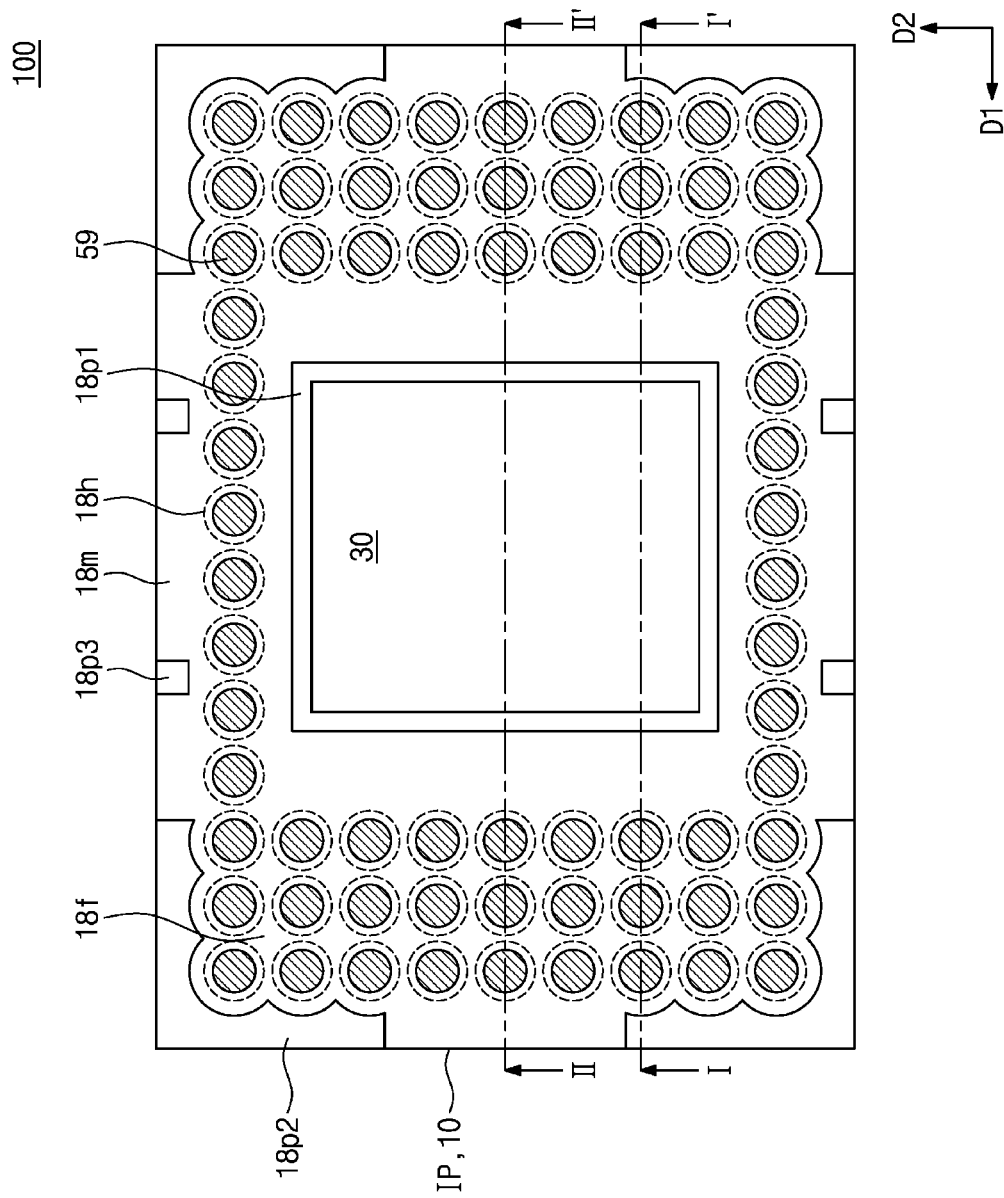
FIG. 1 illustrates a plan view showing a semiconductor package according to exemplary embodiments of the present inventive concepts.
Figure 2:
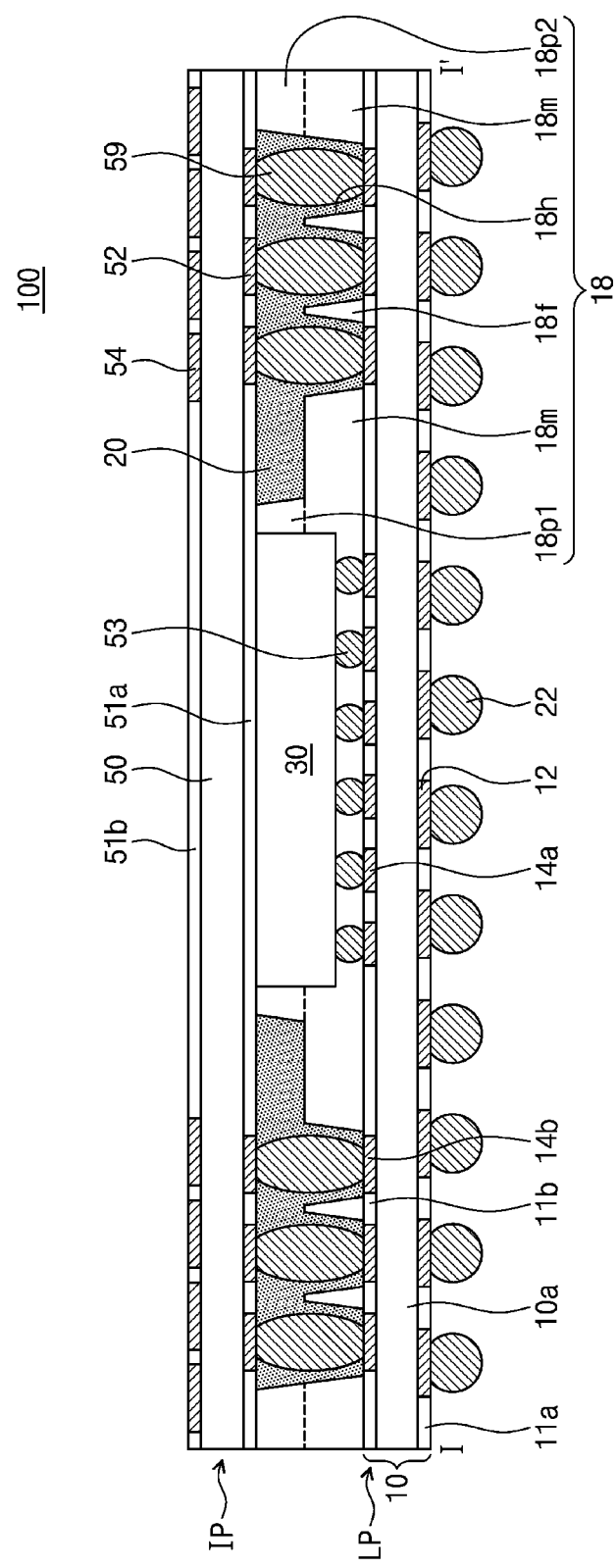
FIG. 2 illustrates a cross-sectional view taken along line I-I' of FIG. 1.
Figure 3:
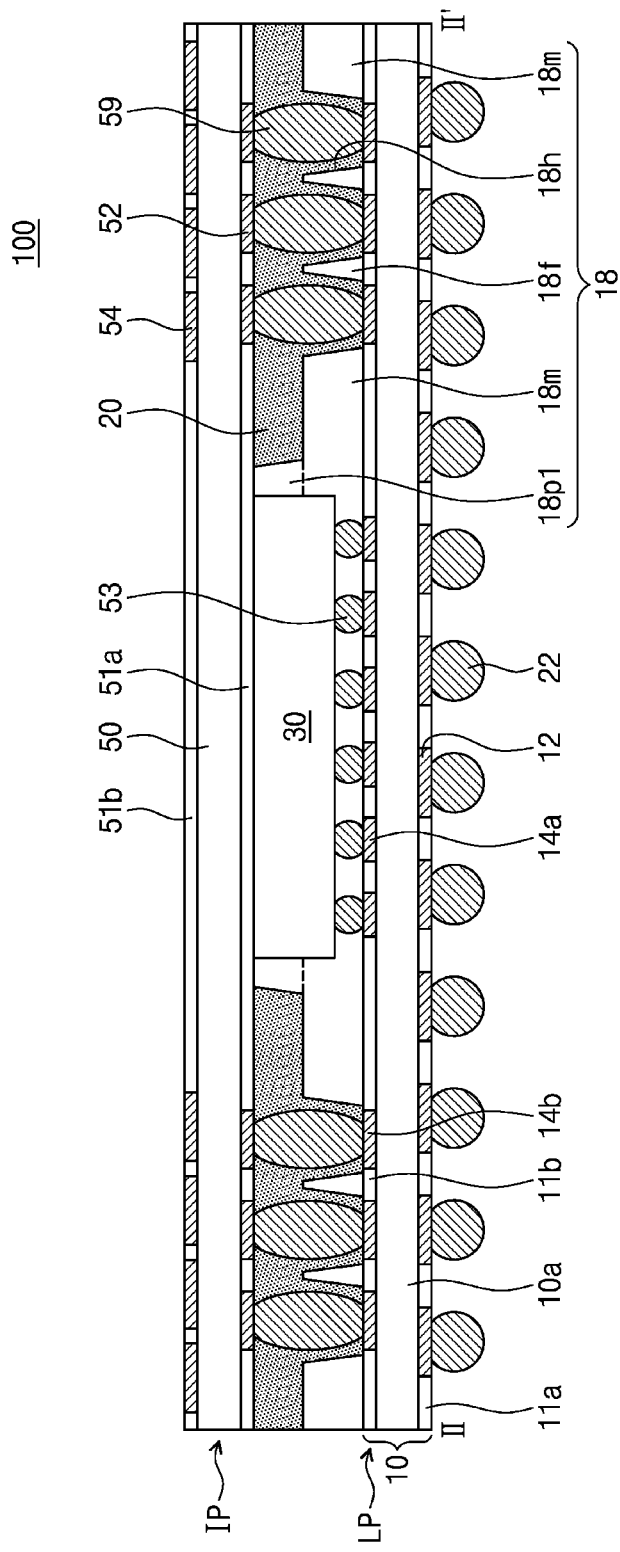
FIG. 3 illustrates a cross-sectional view taken along line II-II' of FIG. 1.
Figure 4:
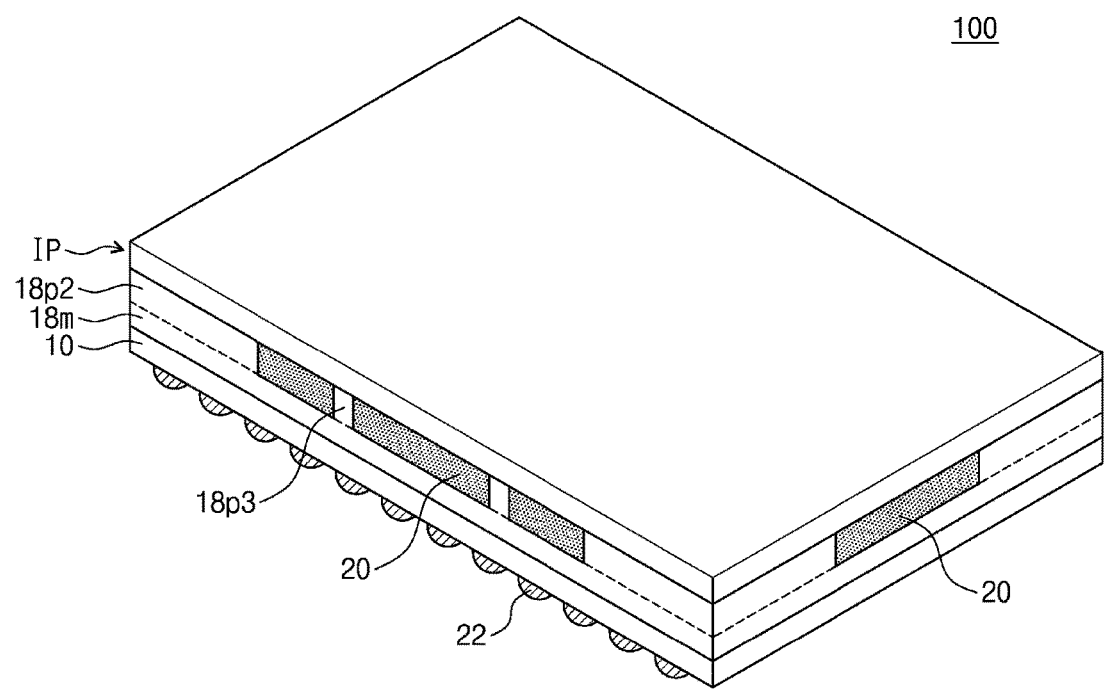
FIG. 4 illustrates a perspective view showing the semiconductor package of FIGS. 1 to 3.
Figure 5:
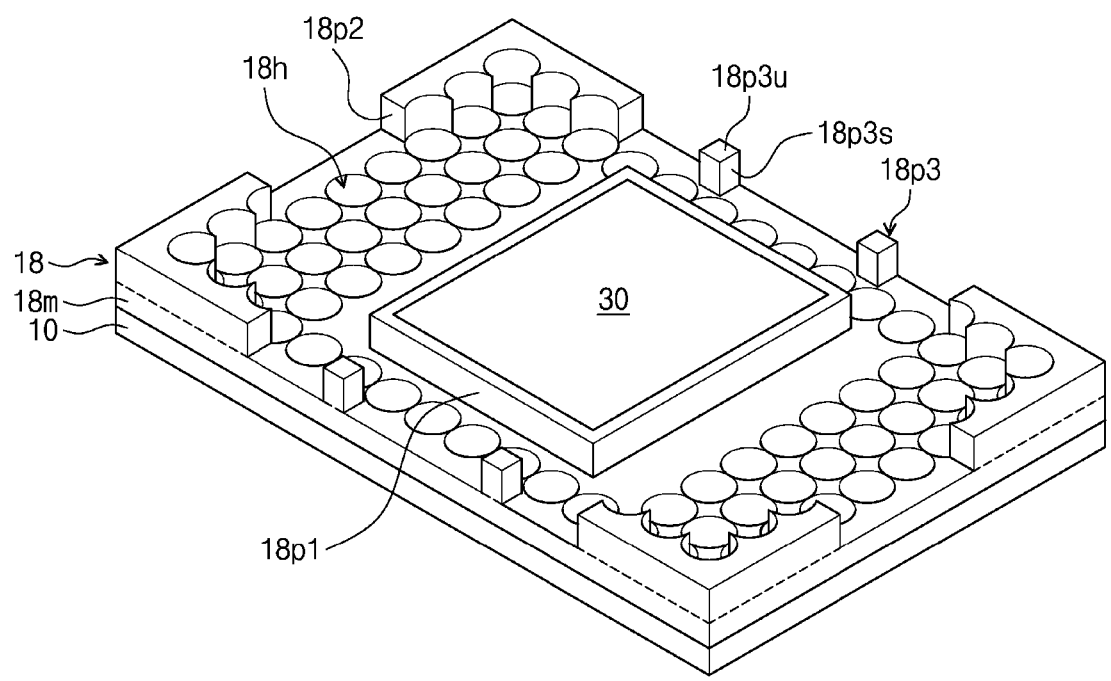
FIG. 5 illustrates a partial perspective view of FIG. 4.

FIG. 1 illustrates a plan view showing a semiconductor package according to exemplary embodiments of the present inventive concepts. FIG. 2 illustrates a cross-sectional view taken along line I-I' of FIG. 1. FIG. 3 illustrates a cross-sectional view taken along line II-II' of FIG. 1. FIG. 4 illustrates a perspective view showing the semiconductor package of FIGS. 1 to 3. FIG. 5 illustrates a partial perspective view of FIG. 4. In particular, FIG. 5 shows a three-dimensional structure of a mold layer 18. Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Referring to FIGS. 1 to 5, a semiconductor package 100 according to exemplary embodiments of the present inventive concepts may have a structure where an interposer IP is stacked on a lower package LP. The lower package LP may include a first substrate 10 and a semiconductor chip 30 mounted on the first substrate 10. The first substrate 10 may include a substrate core 10a formed of, for example, several layers of an insulating material such as epoxy resin or polyimide and a plurality of wiring layers interposed therebetween to provide electrical connections between the semiconductor chip 30 and devices external to the semiconductor package 100). The first substrate 10 may comprise first lower conductive pads 12. The first substrate 10 includes a first lower insulation layer 11a as its bottom surface. The first substrate 10 may be provided on its top surface with first upper conductive pads 14a and second upper conductive pads 14b spaced apart from each other. The top surface of the first substrate 10 may comprise a first upper insulation layer 11b. Although not shown, the wiring layers of the substrate core 10a and conductive vias connecting adjacent wiring layers of the substrate core 10a may form circuit connection lines that electrically connect the first lower conductive pads 12, the first upper conductive pads 14a, and the second upper conductive pads 14b with each other. The first lower conductive pads 12 may be attached thereto with external terminals 22 such as solder balls. The external terminals 22 may include one or more of tin (Sn), lead (Pb), nickel (Ni), gold (Au), silver (Ag), copper (Cu), and bismuth (Bi).

The semiconductor chip 30 may be flip-chip bonded to the first upper conductive pads 14a using internal terminals 53 (e.g., conductive bumps such as solder balls or terminals) that are connected to chip pads (not shown) of the semiconductor chip 30. The internal terminals 53 may include one or more of tin (Sn), lead (Pb), nickel (Ni), gold (Au), silver (Ag), copper (Cu), and bismuth (Bi). The first substrate 10 may be covered with a mold layer 18. The mold layer 18 may be formed of, for example, an epoxy-based material. The mold layer 18 may fill spaces between the internal terminals 53 and between the semiconductor chip 30 and the first upper insulation layer 11b. The mold layer 18 may include a main segment 18m covering the first substrate 10 and further include first, second, and third protrusions 18p1, 18p2, and 18p3 that protrude from the main segment 18m. At least the second and third protrusions 18p2 and 18p3 may be in contact with the interposer IP. It should be understood that when an element is referred to as being "connected" or "coupled" to or "on" another element, it can be directly connected or coupled to or on the other element or intervening elements may be present. In contrast, when an element is referred to as "contacting" or "in contact with" another element (or to as being "directly connected" or "directly coupled" to another element), there are no intervening elements present. The first to third protrusions 18p1, 18p2, and 18p3 may have their top surfaces at the same height. In addition, the top surfaces of the first to third protrusions 18p1, 18p2, and 18p3 may have the same height as that of a top surface of the semiconductor chip 30. It should be appreciated that terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise. The top surfaces of the first to third protrusions 18p1, 18p2, and 18p3 may protrude beyond a top surface of the main segment 18m. Side surfaces of the first to third protrusions 18p1, 18p2, and 18p3 and the top surface of the main segment 18m may constitute an inner surface of a recess region. For example, the mold layer 18 may have a stepped surface caused by the top and side surfaces of the first to third protrusions 18p1, 18p2, and 18p3 and the top surface of the main segment 18m.

The first protrusion 18p1 may be in contact with an upper side surface of the semiconductor chip 30, and may surround the semiconductor chip 30. The second protrusions 18p2 may each have an "L" shape, when viewed in plan. Each of the second protrusions 18*p*2 may be disposed on or adjacent to a corner of the first substrate 10. The third protrusions 18*p*3 may each have a pillar shape. The third protrusions 18*p*3 may be disposed adjacent to a central portion of a sidewall of the first substrate 10.

A plurality of holes 18*h* may be provided on the main segment 18*m*. The holes 18*h* may expose the second upper conductive pads 14*b*. The holes 18*h* may be provided therebetween with a hole separator 18*f* originating from a portion of the main segment 18*m*. The hole separator 18*f* may be formed from portions of the mold layer 18. The holes 18*h* may each be provided therein with a connection member 59 that electrically connects the first substrate 10 and the interposer IP to each other. The connection member 59 is electrically conductive and may include one or more of tin (Sn), lead (Pb), nickel (Ni), gold (Au), silver (Ag), copper (Cu), and bismuth (Bi).

The interposer IP may include a second substrate 50. The second substrate 50 may include, for example, an insulating material such as epoxy resin or polyimide. The second substrate 50 may be provided on its bottom surface with second lower conductive pads 52 in contact with the connection members 59. The second substrate 50 may be provided on its top surface with third upper conductive pads 54. The bottom surface of the second substrate 50 may be covered with a second lower insulation layer 51*a*. The top surface of the second substrate 50 may be covered with a second upper insulation layer 51*b*. The interposer IP may have a structure similar to the substrate 10. For example, the second substrate 50 may be provided therein with circuit connection lines (interposed between adjacent insulative layers (e.g., polyimide layers) of the interposer IP) and vias that form a plurality of wires (or wiring) that electrically connect respective pairs of the second lower conductive pads 52 and the third upper conductive pads 54 with each other. The insulation layers 11*a*, 11*b*, 51*a*, and 51*b* may be formed of polyimide.

An under-fill resin layer 20 may fill a space between the second lower insulation layer 51*a* and the top surface of the main segment 18*m* of the mold layer 18. The under-fill resin layer 20 may be formed of an epoxy-based material. The under-fill resin layer 20 may also fill a space between the connection member 59 and an inner sidewall of the hole 18*h*. The under-fill resin layer 20 may further fill a space between the connection members 59. The under-fill resin layer 20 may even fill a space between the connection member 59 and each of the second and third protrusions 18*p*2 and 18*p*3.

The first to third protrusions 18*p*1, 18*p*2, and 18*p*3 may function as a supporter supporting the interposer IP. The first protrusion 18*p*1 may surround a side surface of the semiconductor chip 30, protecting the side surface of the semiconductor chip 30 in manufacturing the semiconductor package 100. The second protrusions 18*p*2 may adjoin the connection members 59 disposed on or adjacent to the corners of the first substrate 10 to thereby prevent the interposer IP from sliding in first and second directions D1 and D2 perpendicular to each other when the semiconductor package 100 is manufactured, which may cause the semiconductor package 100 to have enhanced reliability. The third protrusions 18*p*3 may be disposed adjacent to the sidewalls of the first substrate 10 that face each other in the second direction D2 to thereby prevent the interposer IP from sliding in the second direction D2 when the semiconductor package 100 is manufactured, which may cause the semiconductor package 100 to have enhanced reliability.

Figure 6:
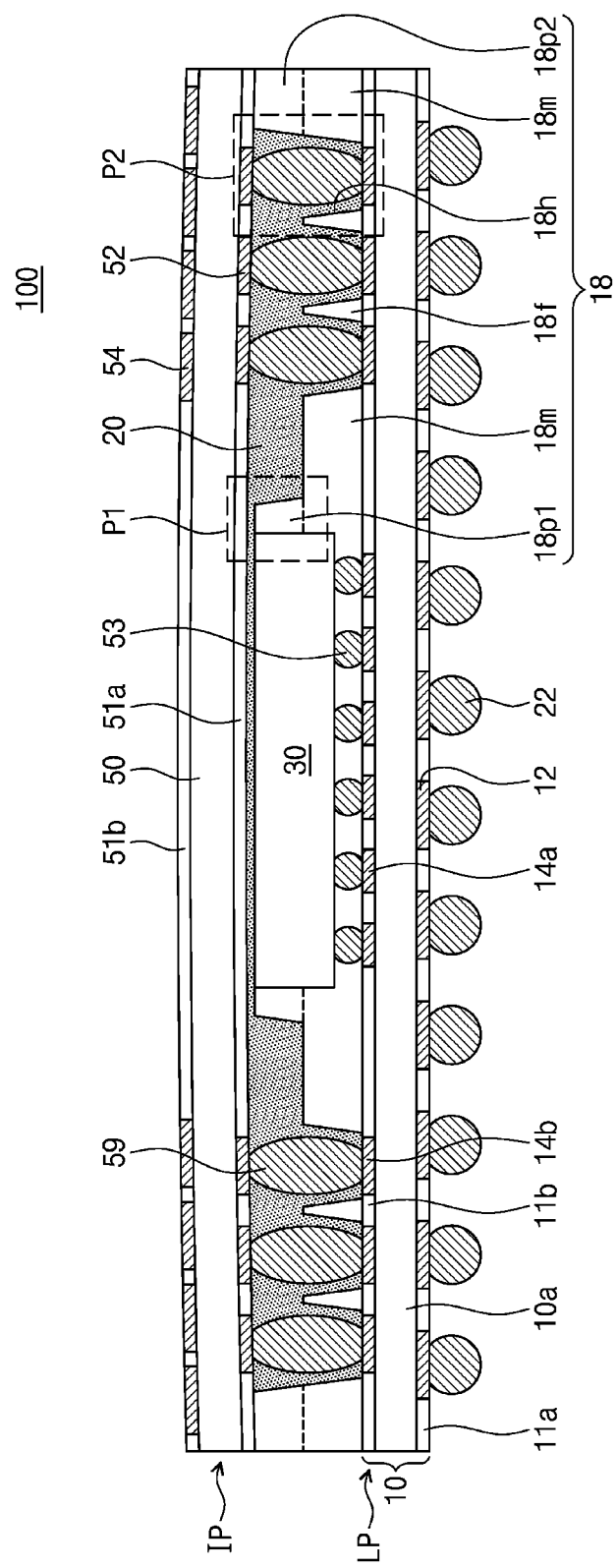
FIG. 6 illustrates a cross-sectional view showing a semiconductor package according to exemplary embodiments of the present inventive concepts.
Figure 7:
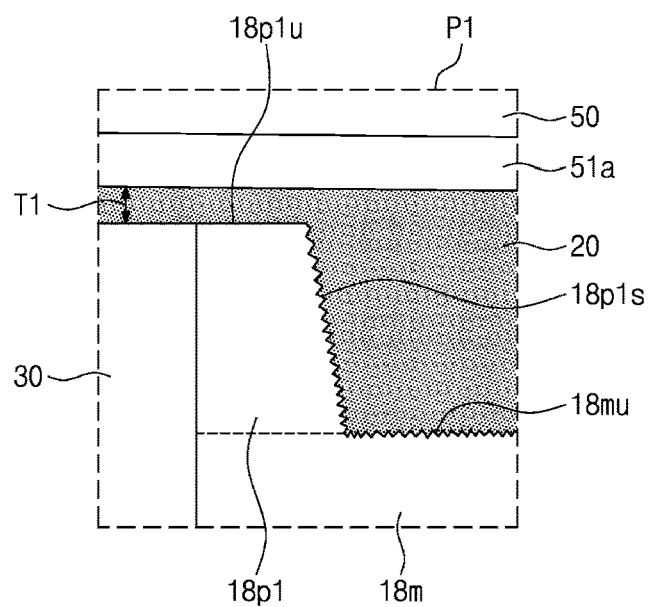
FIGS. 7 and 8 illustrate enlarged views respectively showing sections P1 and P2 of FIG. 6.
Figure 8:
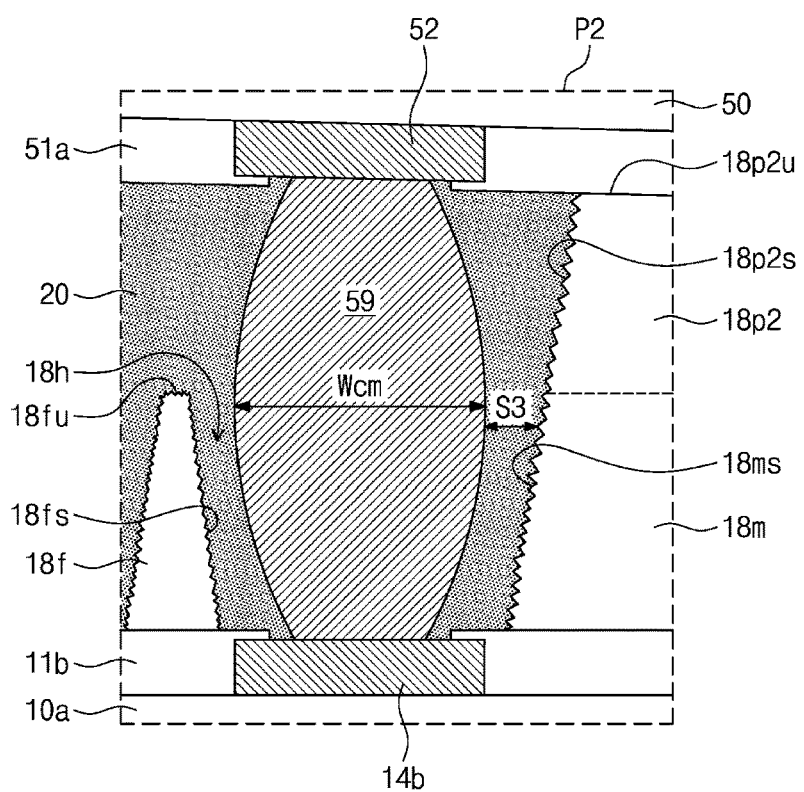

FIG. 6 illustrates a cross-sectional view showing a semiconductor package according to exemplary embodiments of the present inventive concepts. FIGS. 7 and 8 illustrate enlarged views respectively showing sections P1 and P2 of FIG. 6.

The interposer IP may be in contact with the semiconductor chip 30 and the first protrusion 18*p*1, without warpage as illustrated in FIGS. 2 and 3. In contrast, the interposer IP may be slightly bent as illustrated in FIGS. 6 to 8. In such a configuration, the under-fill resin layer 20 may be interposed between the first protrusion 18*p*1 and the interposer IP and between the semiconductor chip 30 and the interposer IP (e.g., at a raised portion of the interposer IP above semiconductor chip 30 due to the warpage of the interposer IP. The under-fill resin layer 20 may have a first thickness T1 of about 10 µm or less between the semiconductor chip 30 and the interposer IP. For example, the first thickness T1 may range from about 5 µm to about 10 µm.

The mold layer 18 may have different surface roughness depending on position. In detail, the first to third protrusions 18*p*1, 18*p*2, and 18*p*3 may have their top surfaces 18*p*1*u*, 18*p*2*u*, and 18*p*3*u* each of which has a surface roughness less than those of other portions of the mold layer 18. For example, the top surfaces 18*p*1*u*, 18*p*2*u*, and 18*p*3*u* of the first to third protrusions 18*p*1, 18*p*2, and 18*p*3 may each have a surface roughness less than those of sidewalls 18*p*1*s*, 18*p*2*s*, and 18*p*3*s* of the first to third protrusions 18*p*1, 18*p*2, and 18*p*3. In addition, the top surfaces 18*p*1*u*, 18*p*2*u*, and 18*p*3*u* of the first to third protrusions 18*p*1, 18*p*2, and 18*p*3 may each have a surface roughness less than that of a top surface 18*mu* of the main segment 18*m*, that of a sidewall 18*ms* of the main segment 18*m*, that of a top surface 18*fu* of the hole separator 18*f*, and that of a sidewall 18*fs* of the hole separator 18*f*. In contrast, the mold layer 18 may have an identical or similar surface roughness on its portions other than the top surfaces 18*p*1*u*, 18*p*2*u*, and 18*p*3*u* of the first to third protrusions 18*p*1, 18*p*2, and 18*p*3. For example, an identical or similar surface roughness may be provided on the sidewalls 18*p*1*s*, 18*p*2*s*, and 18*p*3*s* of the first to third protrusions 18*p*1, 18*p*2, and 18*p*3, on the top surface 18*mu* of the main segment 18*m*, on the sidewall 18*ms* of the main segment 18*m*, on the top surface 18*fu* of the hole separator 18*f*, and on the sidewall 18*fs* of the hole separator 18*f*.

Alternatively, the mold layer 18 may an identical or similar surface roughness regardless of position.

The inner sidewall of the hole 18*h* may be formed either by the sidewall 18*fs* of the hole separator 18*f* or by both the sidewall 18*fs* of the hole separator 18*f* and the sidewall 18*ms* of the main segment 18*m*. The sidewall 18*ms* of the main segment 18*m* may be coplanar with one or more of the sidewalls 18*p*1*s*, 18*p*2*s*, and 18*p*3*s* of the first to third protrusions 18*p*1, 18*p*2, and 18*p*3.

Although not shown, the semiconductor package 100 may include a thermal interface material between the semiconductor chip 30 and the interposer IP. In this configuration, the top surfaces 18*p*1*u*, 18*p*2*u*, 18*p*3*u* of the first, second and third protrusions 18*p*1, 18*p*2 and 18*p*3 may be coplanar with and may have the same height as that of a top surface of the thermal interface material. In some examples, the thermal interface material may further lie between the first protrusion 18*p*1 and the interposer IP. In this case, a top surface of the under-fill resin layer 20 may have the same height as that of the top surface of the thermal interface material. The thermal interface material may include, for example, a silicon-based material and conduct heat at a higher rate than the under-fill resin layer 20 and the mold layer 18.

It will be described below a method of manufacturing a semiconductor package according to exemplary embodiments of the present inventive concepts.

FIGS. 9 to 12, 13A, 13B, 14, and 15 illustrate cross-sectional views showing a method of manufacturing a semiconductor package of FIGS. 1 to 5 according to exemplary embodiments.

Figure 9:
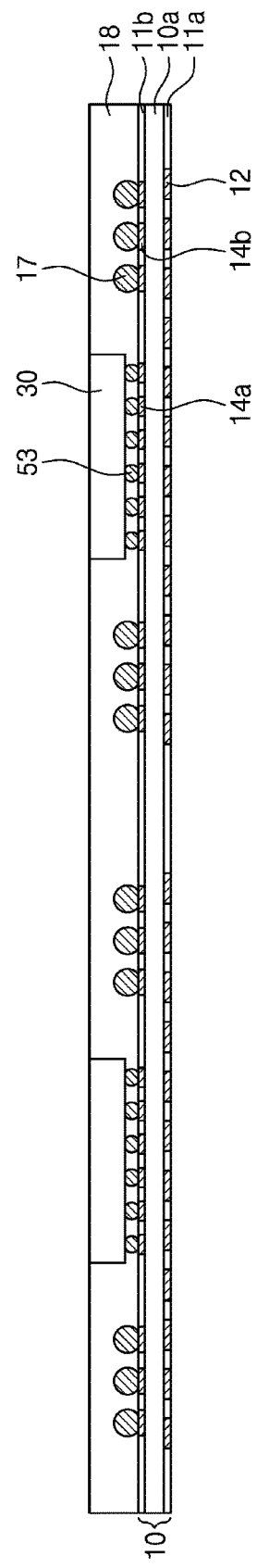

Referring to FIG. 9, a first substrate 10 may be prepared to include a plurality of chip regions (see region A of FIG. 15). Although only two chips in two chip regions are shown in the figures, additional chip regions may be formed. Further, the chip regions may be arranged in a two-dimensional matrix (e.g., spread out in row and column directions from a top down perspective) and may have multiple chips per region (e.g., adjacent to each other in a horizontal direction). Internal terminals 53 such as solder balls may be used to flip-chip mount semiconductor chips 30 on first upper conductive pads 14a of the first substrate 10. In some implementations, semiconductor devices in the form of semiconductor packages (e.g., containing a stack of semiconductor chips) may be mounted in lieu of each semiconductor chip 30. First conductive bumps 17, such as solder balls or pillars, may be bonded to second upper conductive pads 14b of the first substrate 10. The first conductive bumps 17 may each be formed to have a top end height lower than top surfaces of the semiconductor chips 30. The internal terminals 53 and the first conductive bumps 17 may all be formed to include one or more of tin (Sn), lead (Pb), nickel (Ni), gold (Au), silver (Ag), copper (Cu), and bismuth (Bi). A mold frame (not shown) may receive the first substrate 10 to which the semiconductor chips 30 and the first conductive bumps 17 are bonded. A flowable resin solution may be introduced into the mold frame (not shown) and then cured (and hardened) to form a mold layer 18. In this step, a top surface of the semiconductor chip 30 may be in contact with the mold frame, and the mold layer 18 may thus be formed to cover the first substrate 10 and side surfaces of the semiconductor chip 30 while leaving the top surface of the semiconductor chip 30 exposed. The top surface of the mold layer 18 may be flush with and coplanar with the top surface of the semiconductor chip 30.

Figure 10:
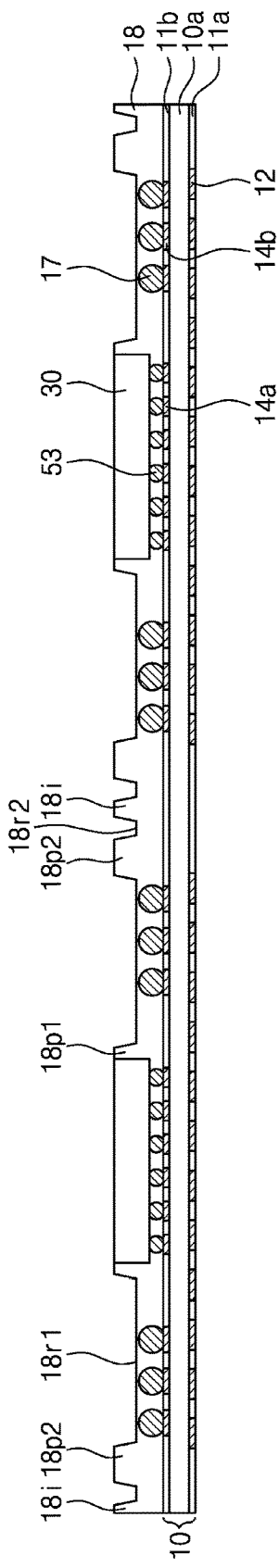

Referring to FIG. 10, the first substrate 10 may be unloaded from the mold frame. A laser may be used to remove portions of the mold layer 18 to form first, second, and third protrusions 18p1, 18p2, and 18p3 (such as described with respect to FIG. 5) and a chip separation protrusion 18i simultaneously with forming a plurality of first and second recess regions 18r1 and 18r2 on an upper portion of the mold layer 18. Top surfaces of the first, second, and third protrusions 18p1, 18p2, and 18p3 may be coplanar with the top surface of the semiconductor chip 30. The first recess regions 18r1 may be formed between the first to third protrusions 18p1, 18p2, and 18p3. Although the first recess regions 18r1 are shown and referenced separately in the vertical cross section figures, these first recess regions 18r1 may be part of a larger single recess (e.g., as part of a substantially ringed shaped recess as shown in FIG. 1). The second recess region 18r2 may be formed between neighboring second protrusions 18p2. As such, each of the first and second recess regions 18r1 and 18r2 of the mold layer 18 may have surfaces having a surface roughness greater than that of a top surface of the mold layer 18. The first to third protrusions 18p1, 18p2, and 18p3 may be formed in the same manner as that discussed with reference to FIGS. 1 to 5. The second and third protrusions 18p2, and 18p3 may be formed to have sidewalls conforming to the shape of first conductive bumps 17 (and later formed conductive connection members 59) formed adjacent thereto (see FIGS. 1 and 5, e.g.). As shown in FIG. 1, a space between the sidewalls of the second and third protrusions 18p2 and 18p3 and the adjacent conductive connection members 59 may be conformally formed about the adjacent conductive connection members 59 which may further assist in positioning the interposer IP when placing the interposer IP on the first substrate 10. When formed adjacent to a row of first conductive bumps 17 (and thus later adjacent to conductive connection members 59), the sidewalls may have a wave shape (with respect to a top down view) with troughs of the waves corresponding to locations of an adjacent first conductive bump 17 (and conductive connection member 59), and crests of the waves corresponding to locations between the first conductive bumps 17 (and conductive connection members 59) of the row. The first protrusion 18p1 may protect the side surface of the semiconductor chip 30. For example, if the side surface of the semiconductor chip 30 is exposed when removing the mold layer 18 with a laser, the laser may damage to the side surface of the semiconductor chip 30. However, the removal of the mold layer 18 may be performed at region(s) spaced apart from the side surface of the semiconductor chip 30 by the first protrusion 18p1, so that it is possible to avoid damaging the side surface of the semiconductor chip 30.

Figure 11:
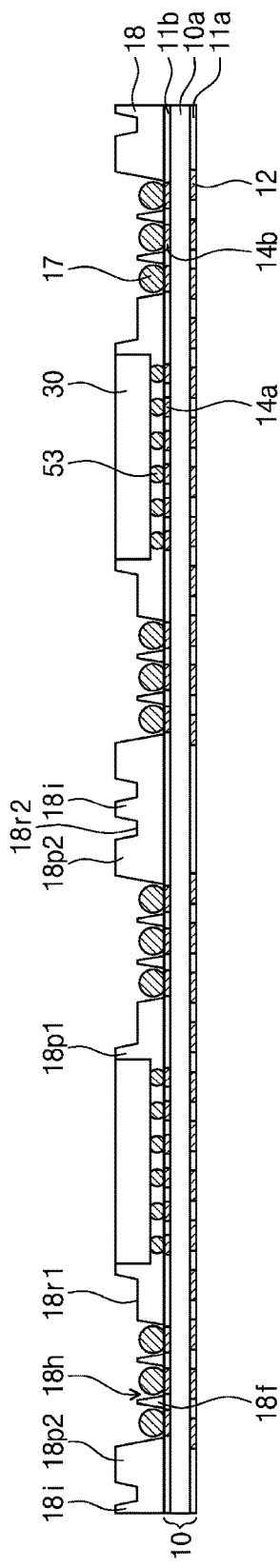

Referring to FIG. 11, a laser may be used to remove portions of the mold layer 18 below the bottom of the first recess regions 18r1 (with respect to the structure of FIG. 10) to thereby form a plurality of holes 18h, each of which exposes a corresponding first conductive bump 17. In addition, hole separators 18f are formed between the holes 18h. When the holes 18h are formed using the laser, the holes 18h may each be formed to have a surface roughness substantially the same as those of the surfaces of the first and second recess regions 18r1 and 18r2.

In alternative method of manufacturing, the mold layer 18 of the embodiments described herein may be formed using a mold frame (having a shape corresponding to the mold layer 18). If the mold layer 18 (e.g., such as that illustrated in FIGS. 1 to 5) is formed by a mold frame instead of the laser, the mold layer 18 may have an identical or similar surface roughness regardless of position. In this alternative method, first conductive bumps may be formed on first lower conductive pads after injecting a flowable resin into the mold frame and curing the resin to harden the resin.

The holes 18h may be formed such that sidewalls 18fs of the hole separators (also forming sidewalls of the holes 18h) extend above the top surfaces of the first conductive bumps 17. Top surfaces 18fu may be higher than the top surfaces of the first conductive bumps 17. As such, when a reflow process is subsequently performed to merge contacting pairs of first conductive bumps 17 and second conductive bumps 57 (e.g., as described below), such reflow may be better contained to avoid unintended contact with neighboring first or second conductive bumps 17, 57. Thus, the spacing between the conductive connection members 59 may be made small which may help decrease the size of the semiconductor package 100 and/or allow for more external terminals 22 to be implemented with the semiconductor package 100. For example, the pitch of regularly spaced conductive connection members 59 may be 1.5 times the horizontal width Wcm of the conductive connection embers 59 or less. Unless context indicates otherwise, it should be appreciated that "width" as used herein may typically refer to a maximum dimension of an element in the width direction (e.g., a width of a cone would likely refer to the diameter of the base of the cone, unless otherwise specified). In addition, unless context dictates otherwise, spacing between two elements typically refers to the minimum spacing the two elements (e.g., spacing between two cones having their bases placed on a surface would likely refer to the minimum distance between the bases of the cones and not refer to a spacing between tips of the cones—unless context indicated otherwise). Such a small pitch may be implemented even with vertically elongated conductive connection members 59 (e.g., having a height equal to or greater than their horizontal width Wcm). In some examples, the first recess regions 18r1 are formed to a depth less than half of the distance between the lower surface of the interposer IP and the upper surface of the first substrate 10 (which may correspond to the height of the later formed conductive connection members 59) to form such sidewalls 18fs.

Figure 12:
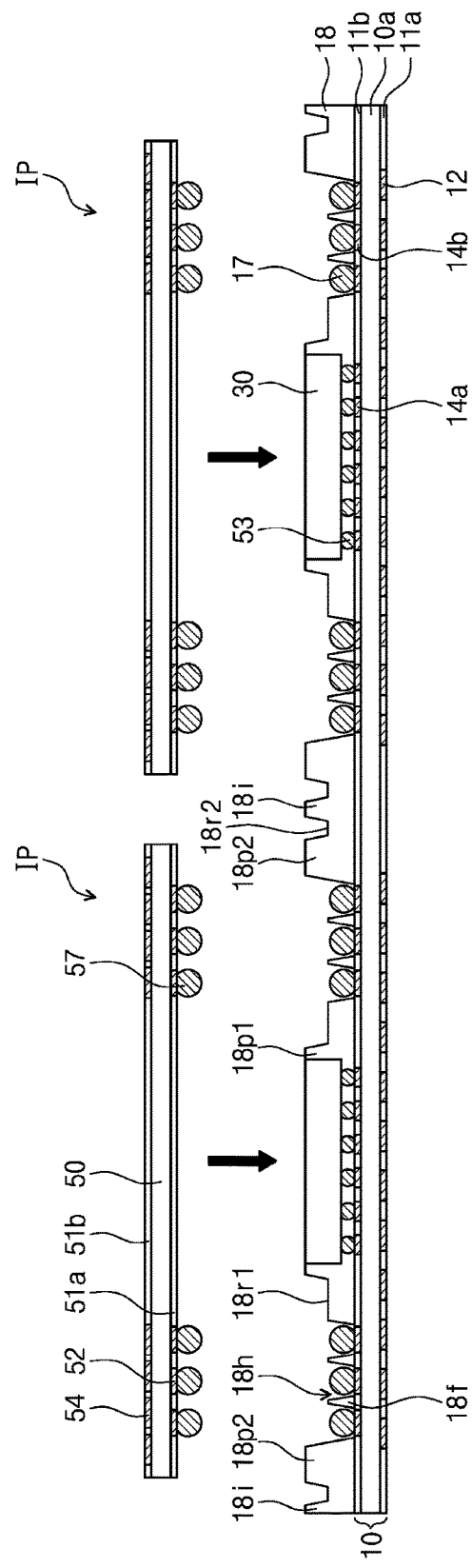
Figure 13A:
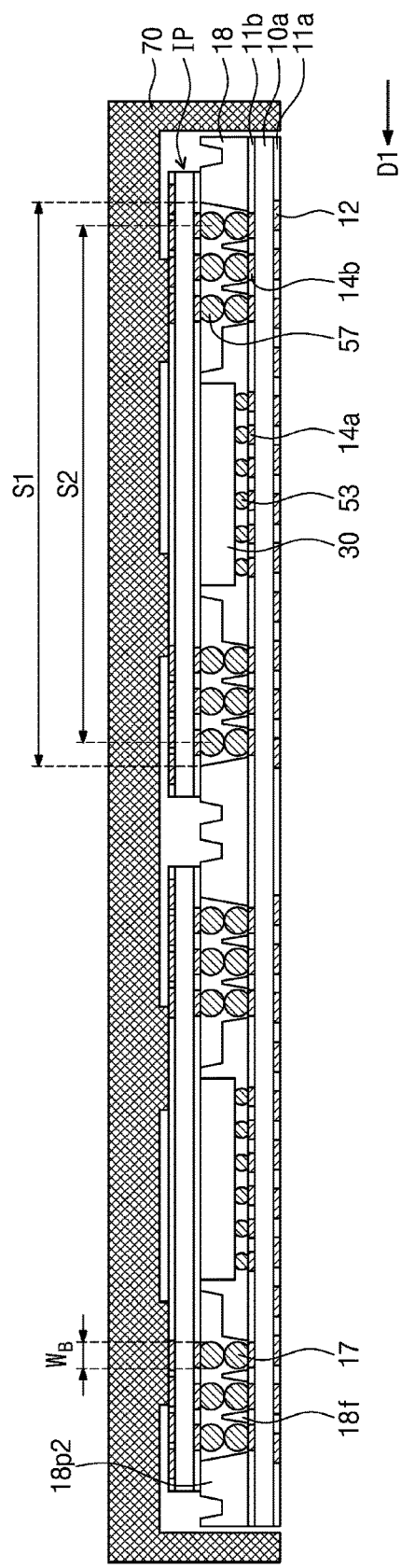

Referring to FIGS. 12, 13A, 13B, and 14, interposers IP may be prepared. Second conductive bumps 57 may be bonded to corresponding second lower conductive pads 52 of the interposers IP. The second conductive bumps 57 may be arranged in a regularly spaced array and may correspond to the arrangement of the first conductive bumps 17 (e.g., have a mirror symmetric arrangement). At a position where the interposers IP overlap corresponding semiconductor chips 30, each of the interposers IP may be placed to come into contact with the first to third protrusions 18p1, 18p2, and 18p3. In this step, the first to third protrusions 18p1, 18p2, and 18p3 may function as a supporter supporting the interposer IP. For example, the first to third protrusions 18p1, 18p2, and 18p3 may be brought into contact with the lower surface of a corresponding interposer IP (e.g., see FIG. 13A) and support each interposer IP. In some examples, a single continuous interposer (e.g., a single continuous interposer that includes a connection portion connecting the discrete interposers IP shown in FIGS. 12 and 13A) may be brought into contact with the first to third protrusions 18p1, 18p2, and 18p3 and may be later cut (e.g., as part of cutting substrate and 10 to separate the chip regions as described herein) to provide separate discrete interposers IP, such as shown in FIGS. 12 and 13A. The second conductive bumps 57 may contact corresponding first conductive bumps 17. A reflow process may be performed to provide heat to merge the first conductive bumps 17 with corresponding second conductive bumps 57 into a homogenous structure, thereby forming connection members 59 (see FIG. 14). The reflow process may be carried out while a jig 70 is used to press the interposers IP downwardly (see FIG. 13A) so as to prevent the interposers IP from warping.

Figure 13B:
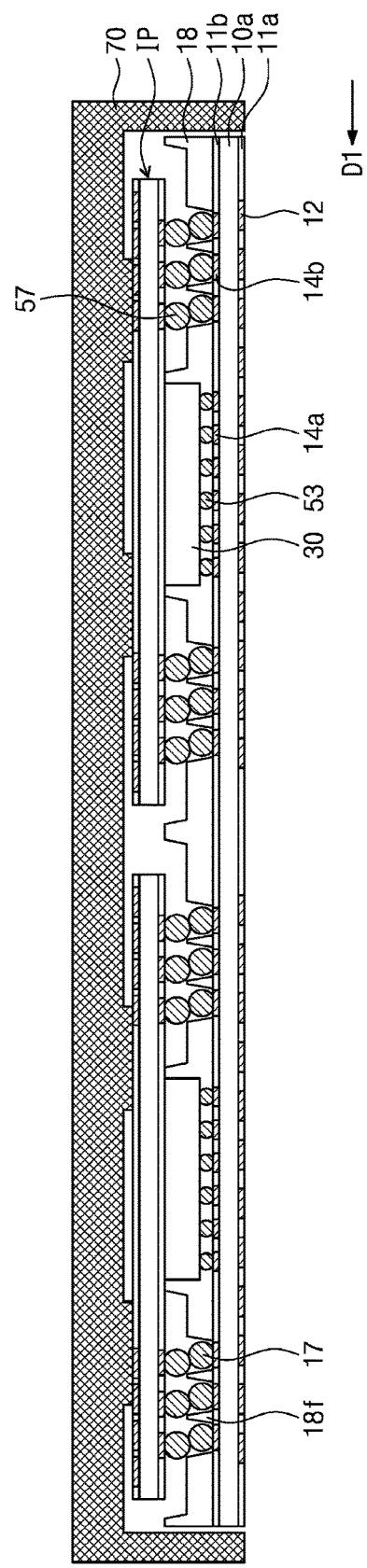

FIG. 13B is a comparative example where the second and third protrusions 18p2 and 18p3 are not provided. When the interposers IP receive force from the jig 70 before the reflow process is performed, as illustrated in FIG. 13B, the interposers IP may laterally slide (e.g., in a first direction D1) due to round surfaces of the first and second conductive bumps 17 and 57. When the second and third protrusions 18p2 and 18p3 are not provided, the interposers IP may move from their proper positions such that one or more the first conductive bumps 17 undesirably come into contact with (or connect to during the reflow process) an undesired second conductive bumps 57 (e.g., a second conductive bump 57 neighboring the intended second conductive bump 57 to be contacted), which may result in failure. The second and third protrusions 18p2 and 18p3 may prevent the interposers IP from sliding, preferably in multiple horizontal directions, such as in the first direction D1 (left or right with respect to FIG. 13A) and/or the second direction (out of the paper of FIG. 13A), rear (in and out of the paper of FIG. 13A), and therefore may decrease in failure rate and increase in manufacturing yield when forming semiconductor packages. In some examples (e.g., see FIGS. 1 and 5), one or more of the second protrusions 18p2 may have an "L" shape, with respect to a plan view, and may be disposed on or adjacent to four corners of the chip regions of the first substrate 10 (e.g., see region A of FIG. 15), preventing the interposers IP from sliding in first and second directions D1 and D2. The conductive connection members 59 may be formed in a two-dimensional array with a boundary of the array including a corner located adjacent the interior angle of one or more of the "L" shaped protrusions 18p2. It will be appreciated that the regular spacing of the conductive connection members need not continue through the entire area within the boundaries of the array, but may be interrupted to provide larger spacing (e.g., to allow for placement of the semiconductor chip 30). The third protrusions 18p3 may be disposed along edges of the chip regions of first substrate 10 that face each other in the second direction D2, preventing the interposers IP from sliding in the second direction D2.

For example, pairs of second and/or third protrusions 18p2 and/or 18p3 may be formed to have a horizontal spacing between them correlating to a distance between two outermost ones of the second conductive bumps 57 to prevent incorrect positioning of the second conductive bumps 57 in a horizontal direction as the interposer is placed on the first substrate. For instance, referring to FIG. 13A, the distance between two of the second and/or third protrusions 18p2 and/or 18p3 may be a first distance S1, the distance between two outermost ones of second conductive bumps 57 (center to center) may be spaced apart by a second distance S2, and the difference between the first distance S1 and the second distance S2 may be less than 3 times the width (horizontal width with respect to FIG. 13A, which may correspond to the diameter $W_B$ of the second conductive bumps 57 when provided in spherical form) of the second conductive bumps (e.g., leaving a space no more than the width of the second conductive bumps 57 between the outermost second conductive bumps 57 and the adjacent second or third protrusion 18p2, 18p3). The difference between the first distance S1 and the second distance S2 may be less than 2 times the horizontal width of the second conductive bumps 57 to leave a space no more than 50% of the width of the second conductive bumps 57. Smaller spacing may be implemented to provide better positioning of the interposer IP by virtue of fitting the projection of the array of second conductive bumps 57 within the first recess regions 18r1 defined by the protrusions 18p1, 18p2 and 18p3. For example, spacing between outermost ones of second conductive bumps 57 that are positioned adjacent a second or third protrusion 18p2, 18p3 may be no more than 20% of width of the second conductive bumps 57. Various pairs of second and/or third protrusions 18p2 and/or 18p3 may be spaced apart in the first direction D1 and in the second direction D2 having the horizontal spacing that correlates to the spacing of the outermost ones of the second conductive bumps 57 positioned therebetween as noted herein.

It should be appreciated that after performing the reflow process described with respect to FIG. 14, the spacing between pairs of protrusions 18p2 and/or 18p3 with respect to positioning of the outermost second conductive bumps 57 positioned therebetween and their widths is substantially the same as that with respect to the positioning of the conductive connection members 59 and the widths of the conductive connection members 59 and should be understood to fall within the scope of various embodiments of the invention. See, FIGS. 8 and 14. For example, conductive connection member 59 positioned adjacent second protrusion 18p2 in FIG. 8 may be spaced apart from second protrusion 18p2 by a distance of S3, which may be less than the width Wcm of the conductive connection member 59, such no more than 50% of width Wcm, such as no more than 20% of width Wcm.

It should also be appreciated that similar results may be achieved with similar relationships between the spacing of pairs of second conductive bumps 57 that are adjacent pairs of protrusions that are located between such pairs of second conductive bumps 57. Such alternatives, including the positional and spacing details regarding the second conductive bumps 57, the conductive connection members 59 and the protrusions are equally applicable with respect to this alternative, however, it will be appreciated that the protrusions to which the conductive connection members 59 are adjacent may also include third protrusions 18p3 and that the second distance S2 would exceed the first distance S1 in this instance.

Referring to FIG. 14, an under-fill resin layer 20 may be formed by introducing a resin solution into a space between the interposer IP and a main segment 18m of the mold layer 18. The resin solution, initially be flowable, may be injected into the mold formed by jig 70 and then be allowed to harden. A capillary phenomenon may allow the resin solution to enter the space between the interposer IP and the main segment 18m of the mold layer 18 and to enter the holes 18h. When the main segment 18m of the mold layer 18 have their top surfaces at the same height as those of top surfaces of the first to third protrusions 18p1, 18p2, and 18p3, no space may be created between the interposer IP and the main segment 18m of the mold layer 18, and in turn the resin solution may hardly fill the holes 18h due to its poor flow properties. Therefore, it is very likely that voids would be created in the holes 18h and in the resulting semiconductor package. When the voids are created, moisture and/or process byproducts may remain in the voids, decreasing the reliability of a semiconductor package. However, by providing a space between the interposer IP and the main segment 18m of the mold layer 18 (or the first recess region 18r1) the resin solution sufficiently flows, thereby dramatically reducing the probability of occurrence of the voids. The size and position of the main segment 18m having a reduced height may facilitate this resin solution flow to provide a flow channel for the resin solution when forming the under-fill resin layer 20. For example, the main segment 18m may be formed at locations near the middle of the semiconductor package 100 and be adjacent to the semiconductor chip 30. The size of the portion of the recess region 18r1 formed above main segment 18m where no conductive connection members 59 are formed may be at least the width of the conductive connection members 59, for example 1.5 times the width of the conductive connection members 59 or greater. The size of the portion of the recess region 18r1 formed above main segment 18m where no conductive connection members 59 are formed may be significantly greater than the minimum spacing between adjacent connection members 59, such as greater than two times or greater than three times such spacing. Similarly, when the heights of the hole separators 18f are reduced to be lower than the bottom of the interposer IP, the resulting space between the hole separators 18f and the interposer IP allows the resin solution to sufficiently flow (e.g., over the tops of hole separators 18f) to reduce the probability of creating voids when forming under-fill resin layer 20. As noted herein, however, maintaining a height of the separators 18f greater than the height of the first conductive bumps 17 may be desirable to provide a closely packed array of conductive connection members 59. Thus, a height of separators 18f (and the corresponding to the top surfaces 18fu of the separators 18f) may be formed of reduced height but may be over half of the height of the conductive connection members 59 in some examples, such as between 50% and 75% of the height of the conductive connection members 59, such as between 55% to 65% of the height of the conductive connection members 59. As a result, a semiconductor package may be provided with enhanced reliability.

Referring to FIGS. 15 and 2, outer external terminals 22 such as solder balls may be bonded to first lower conductive pads 12 of the first substrate 10. A singulation process, such as laser ablation, may be performed to remove an edge region B other than the chip region A to manufacture an individual semiconductor package 100. In this step, the chip separation protrusion 18i may also be removed.

Figure 16:
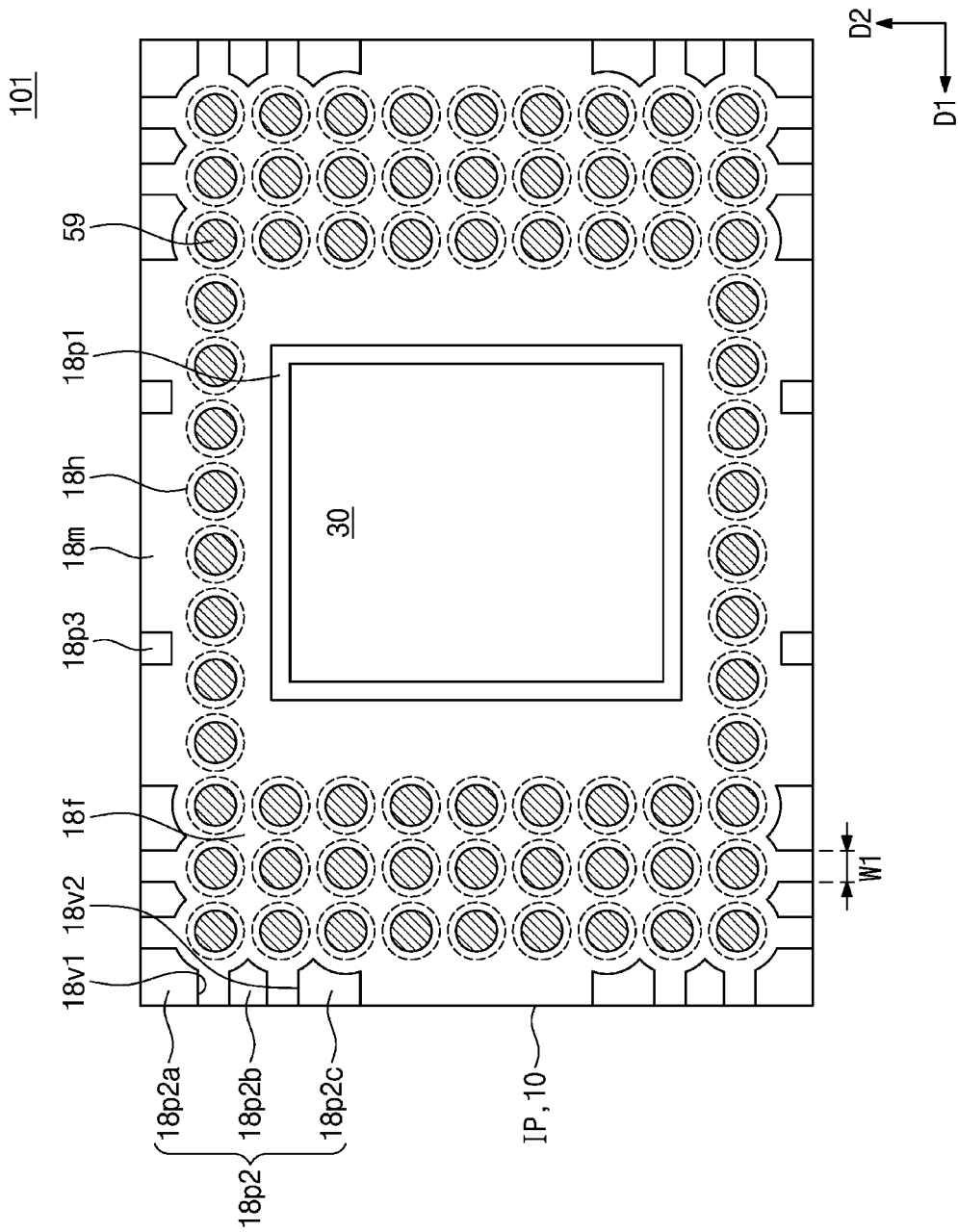
FIG. 16 illustrates a plan view showing a semiconductor package according to exemplary embodiments of the present inventive concepts.
Figure 17:
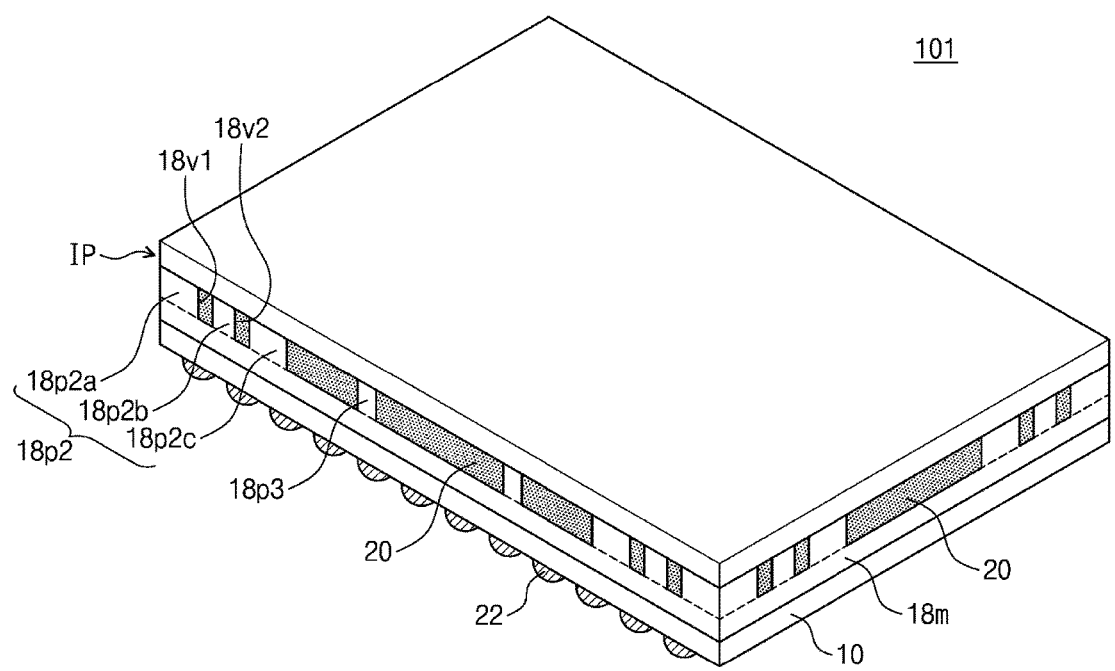
FIG. 17 illustrates a perspective view showing a semiconductor package with the plan view of FIG. 16.

FIG. 16 illustrates a plan view showing a semiconductor package according to exemplary embodiments of the present inventive concepts. FIG. 17 illustrates a perspective view showing a semiconductor package with the plan view of FIG. 16.

Referring to FIGS. 16 and 17, a semiconductor package 101 of the present embodiment may be configured such that the second protrusion 18p2 may include a first sub-protrusion 18p2a, second sub-protrusions 18p2b, and third sub-protrusions 18p2c, which are spaced apart from each other. The first sub-protrusion 18p2a may be disposed on or adjacent to the corner of the first substrate 10. The second sub-protrusions 18p2b may be disposed adjacent to two sides of the first sub-protrusion 18p2a. The third sub-protrusions 18p2c may be disposed adjacent to their neighboring second sub-protrusions 18p2b. When viewed in plan, an "L" shape may be produced when the first to third sub-protrusions 18p2a, 18p2b, and 18p2c are linearly connected to each other. The first sub-protrusion 18p2a and the second sub-protrusion 18p2b may include therebetween a space corresponding to a first vent 18v1. The second sub-protrusion 18p2b and the third sub-protrusion 18p2c may include therebetween a space corresponding to a second vent 18v2. The first and second vents 18v1 and 18v2 may allow the resin solution to more sufficiently flow in the process in which the under-fill resin layer 20 is formed as illustrated in FIG. 14, preventing occurrence of voids on a zone in the vicinity of the second protrusion 18p2. As a result, the semiconductor package 101 may increase in reliability. To achieve the sufficient flow of the resin solution, the first and second vents 18v1 and 18v2 may each have a first width W1 of about 15 μm or more. For example, the first width W1 may range from about 15 μm to about 80 μm.

Figure 18:
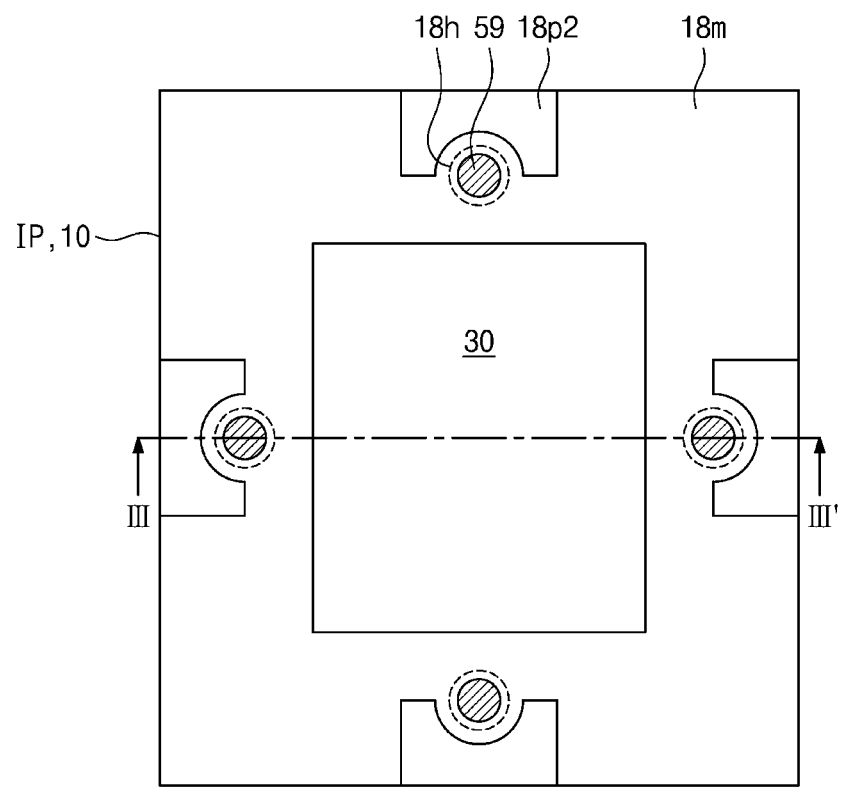
FIG. 18 illustrates a plan view showing a semiconductor package according to exemplary embodiments of the present inventive concepts.
Figure 19:
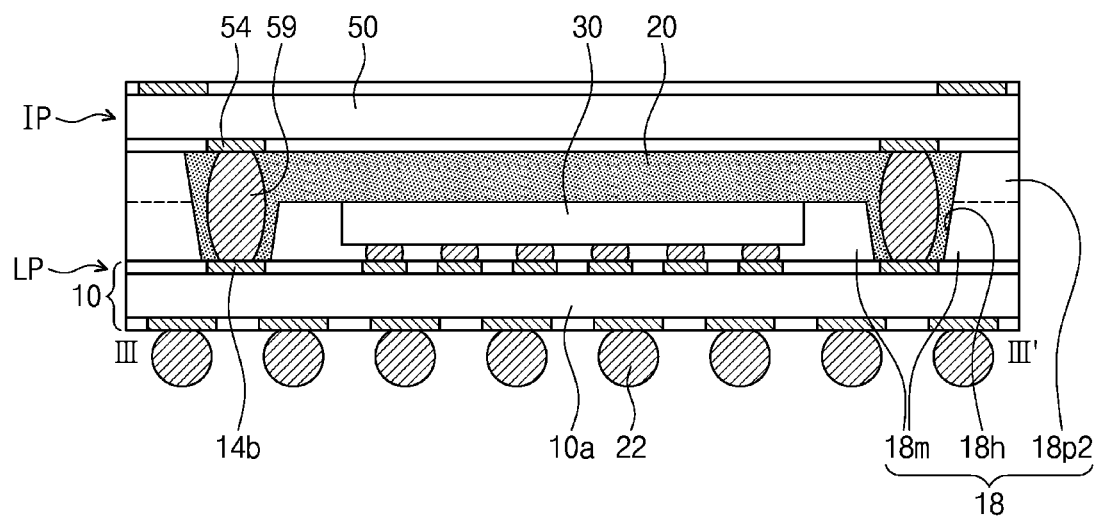
FIG. 19 illustrates a cross-sectional view taken along line III-III' of FIG. 18.

FIG. 18 illustrates a plan view showing a semiconductor package according to exemplary embodiments of the present inventive concepts. FIG. 19 illustrates a cross-sectional view taken along line III-III' of FIG. 18.

Referring to FIGS. 18 and 19, a semiconductor package 102 of the present embodiment may be configured such that four connection members 59 may be disposed adjacent to central portions of four sidewalls of the first substrate 10. Only four connection members 59 are illustrated for ease of description, however additional connection members 59 may be provided such as described with respect to other embodiments. The mold layer 18 may include the main segment 18m, the holes 18h, and the second protrusions 18p2. In the present embodiment, the second protrusion 18p2 may have a "C" shape, when viewed in plan. The second protrusion 18p2 may be disposed adjacent to the connection member 59 to thereby prevent the interposer IP form sliding in the first and second directions D1 and D2 when the semiconductor package 102 is manufactured. The top surface of the semiconductor chip 30 may be spaced apart from the interposer IP, without being in contact therewith. The top surface of the semiconductor chip 30 may have a height the same as that of the top surface of the main segment 18*m*. The main segment 18*m* may protect the side surface of the semiconductor chip 30. The under-fill resin layer 20 may be interposed between the semiconductor chip 30 and the interposer IP. Other configurations and manufacturing processes may be identical or similar to those discussed with reference to FIGS. 1 to 15.

Figure 20:
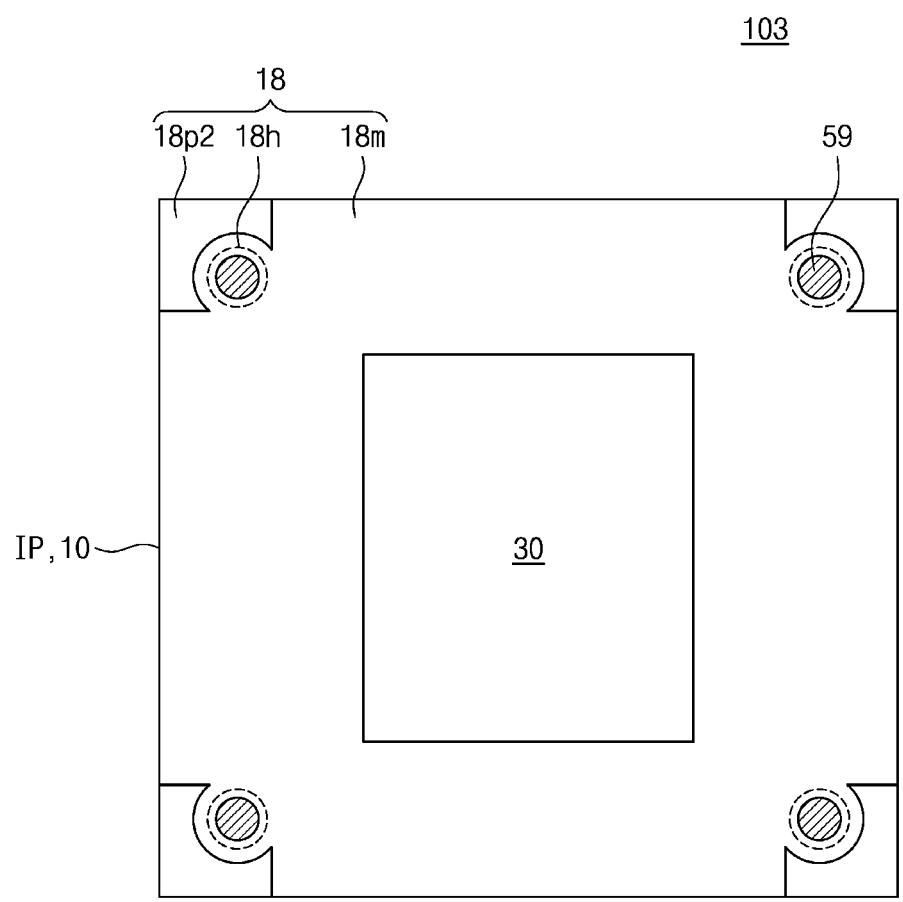
FIG. 20 illustrates a plan view showing a semiconductor package according to exemplary embodiments of the present inventive concepts.

FIG. 20 illustrates a plan view showing a semiconductor package according to exemplary embodiments of the present inventive concepts.

Referring to FIG. 20, a semiconductor package 103 of the present embodiment may be configured such that four connection members 59 may be disposed adjacent to four corners of the first substrate 10. The mold layer 18 may include the main segment 18*m*, the holes 18*h*, and the second protrusions 18*p*2. Only four connection members 59 are illustrated for ease of description, however additional connection members 59 may be provided such as described with respect to other embodiments. In the present embodiment, when viewed in plan, the second protrusion 18*p*2 may have an "L" shape. The second protrusion 18*p*2 may be disposed adjacent to the connection member 59 to thereby prevent the interposer IP form sliding in the first and second directions D1 and D2 when the semiconductor package 103 is manufactured. Other configurations may be identical or similar to those discussed with reference to FIGS. 18 and 19.

Figure 21:
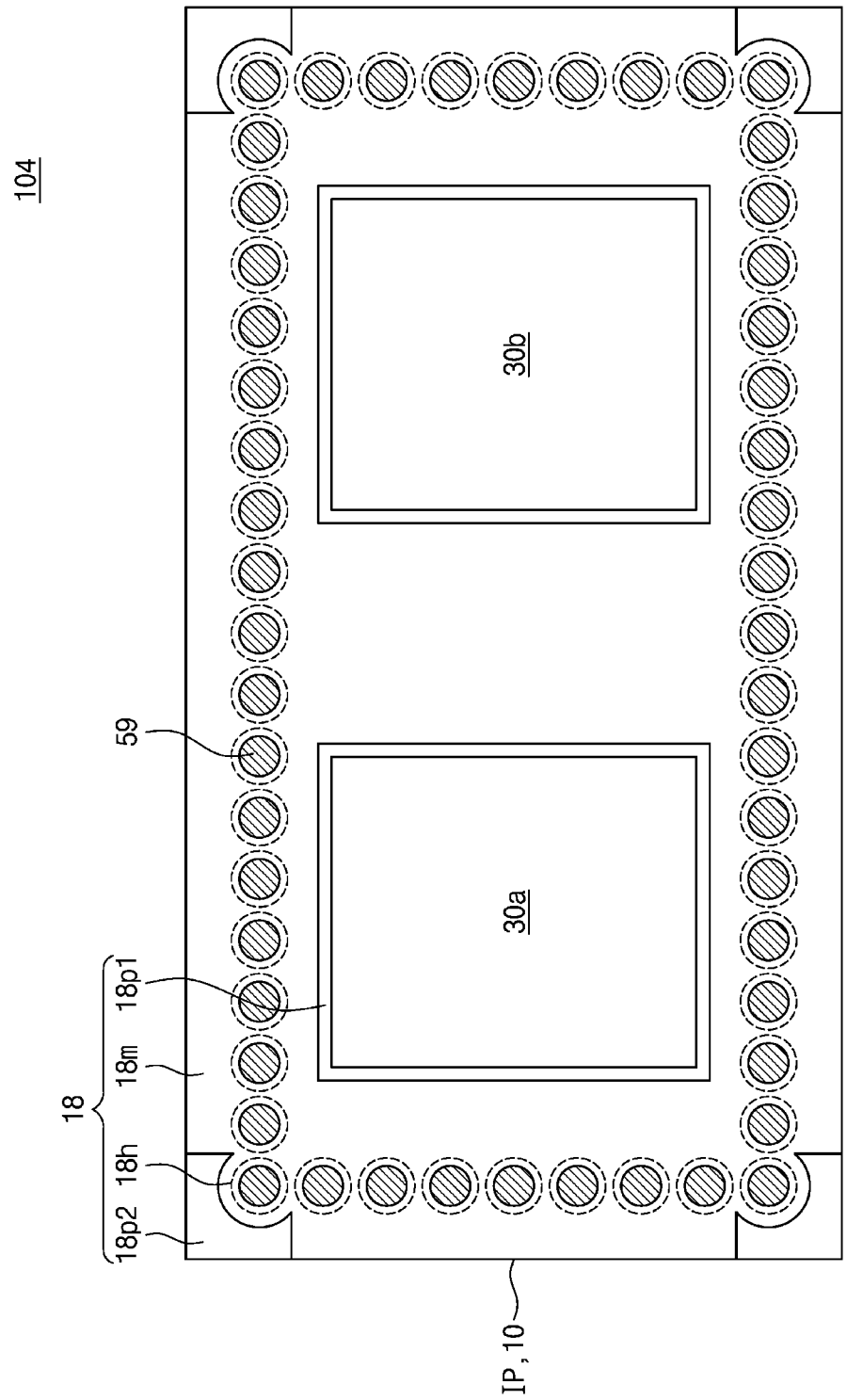
FIG. 21 illustrates a plan view showing a semiconductor package according to exemplary embodiments of the present inventive concepts.

FIG. 21 illustrates a plan view showing a semiconductor package according to exemplary embodiments of the present inventive concepts.

Referring to FIG. 21, a semiconductor package 104 of the present embodiment may be configured as an SIP (System In Package) structure in which a plurality of semiconductor chips 30*a* and 30*b* are mounted on a first substrate 10 and packaged together within the same semiconductor package 104. The semiconductor chips 30*a* and 30*b* may be different types from each other (e.g., a memory chip and a memory controller chip, or different types of memory chips, such as volatile and non-volatile memory chips). A plurality of connection members 59 may be linearly disposed along fourth sidewalls of the first substrate 10. The second protrusions 18*p*2 may lie adjacent to the connection members 59 disposed near four corners of the first substrate 10. The second protrusion 18*p*2 may have an "L" shape, when viewed in plan. The mold layer 18 of the present embodiment may include the main segment 18*m*, the holes 18*h*, the first protrusions 18*p*1, and the second protrusions 18*p*2. In the present embodiment, two semiconductor chips 30*a* and 30*b* are mounted on the first substrate 10, but the number of the semiconductor chips 30*a* and 30*b* are not limited thereto but may be three or more. Other configurations may be identical or similar to those discussed with reference to FIGS. 1 to 5.

Figure 22:
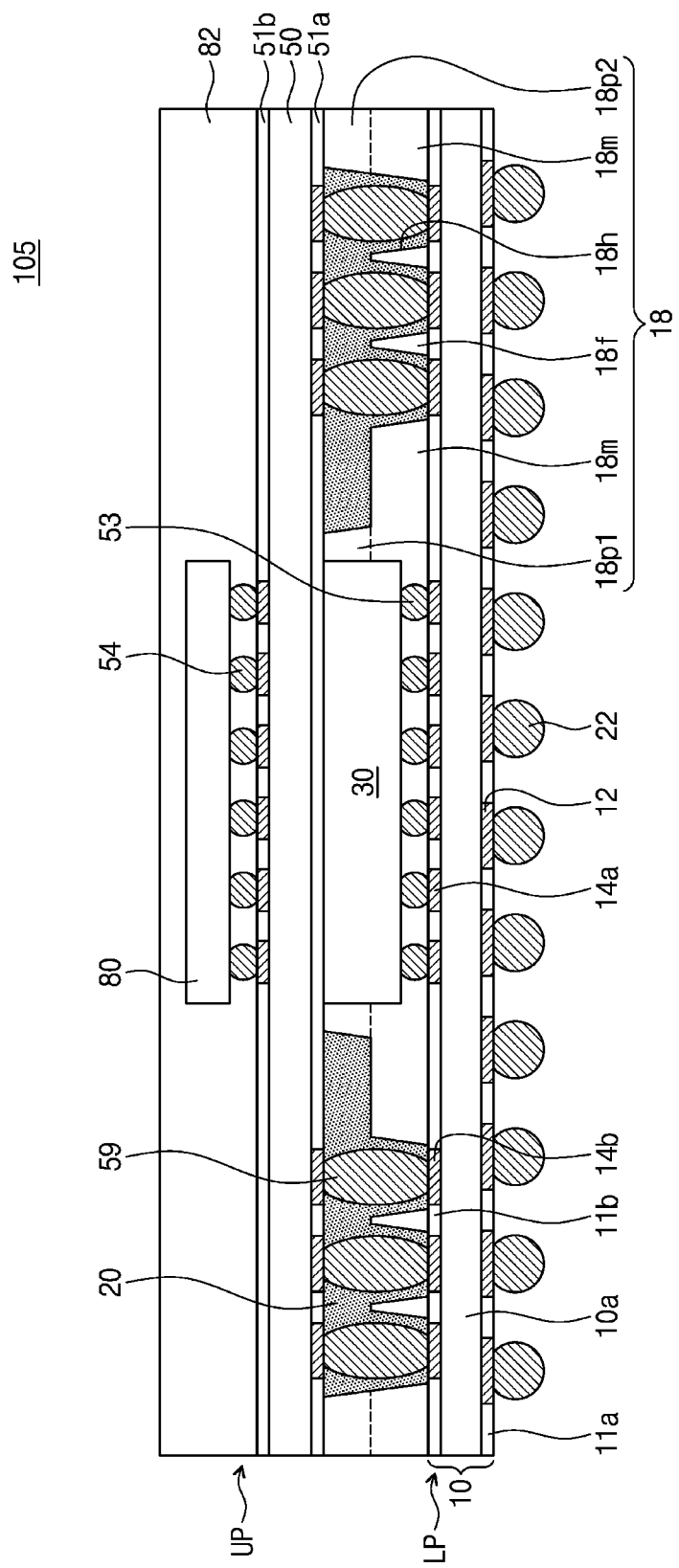
FIG. 22 illustrates a cross-sectional view showing a semiconductor package according to exemplary embodiments of the present inventive concepts.
Figure 23:
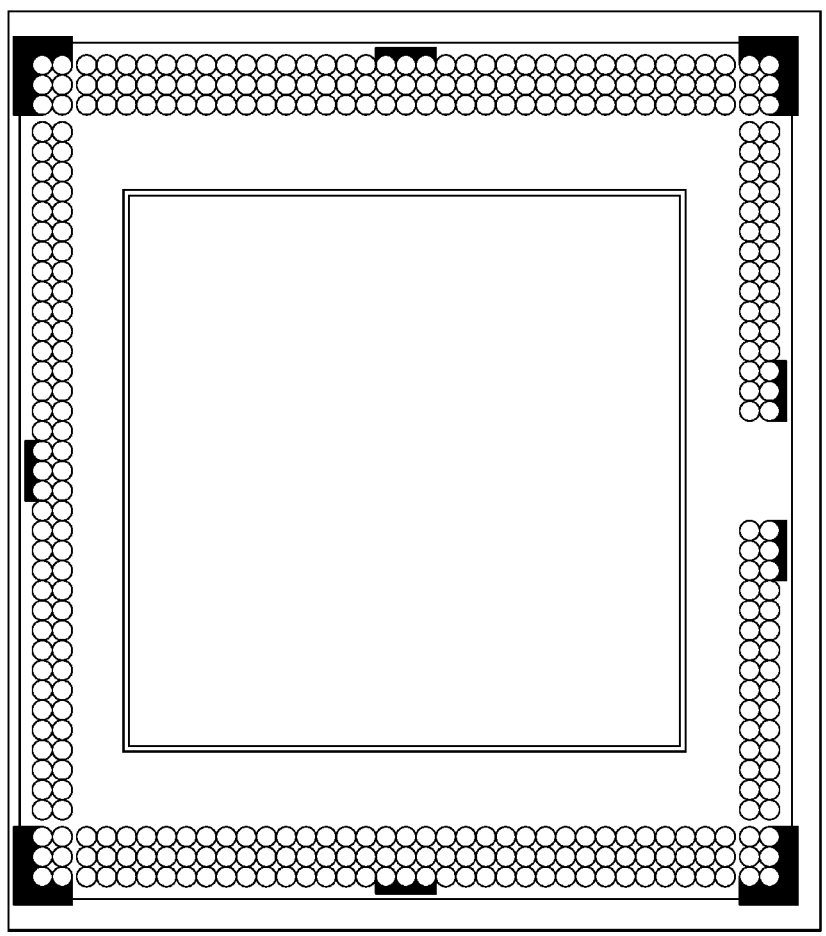
FIG. 23 illustrates a plan view showing a semiconductor package according to exemplary embodiments of the present inventive concepts.

FIG. 22 illustrates a cross-sectional view showing a semiconductor package according to exemplary embodiments of the present inventive concepts.

Referring to FIG. 22, a semiconductor package 105 of the present embodiment may have a POP (Package On Package) structure in which an upper package UP is mounted on a lower package LP. The upper package UP may be configured such that an upper semiconductor chip 80 may be flip-chip mounted on the third upper conductive pad 54 of the second substrate 50. The second substrate 50 may be covered with an upper mold layer 82. Other configurations may be identical or similar to those discussed with reference to FIGS. 1 to 5.

According to exemplary embodiments of the present inventive concepts, occurrence of voids may be reduced in the under-fill resin layer and the connection members may be prevented from contacting each other, which may provide a semiconductor package having enhanced reliability.

While the invention has been described with respect to the specific exemplary embodiments set forth herein, it will be understood that various alternatives may be implemented other than these examples without departing from the spirit and scope of the following claims.

We claim:

1. A method of manufacturing a semiconductor package comprising:
    attaching a plurality of first conductive bumps to respective first conductive pads provided on an upper surface of a first substrate;
    providing an interposer with a plurality of second conductive bumps attached to respective second conductive pads on a bottom surface of the interposer;
    flip chip mounting a first semiconductor chip to the first substrate including electrically connecting the first semiconductor chip to third conductive pads provided on the upper surface of the first substrate;
    forming an insulative mold layer on the upper surface of the first substrate to cover and surround the first conductive bumps, the insulative mold layer extending along sidewalls of the first semiconductor chip and having an upper surface at least as high as an upper surface of the first semiconductor chip;
    etching the mold layer to provide a recess in the mold layer, to define upwardly extending protrusions formed of the etched mold layer and to expose the first conductive bumps;
    placing the interposer on the first substrate so that each of the plurality of second conductive bumps on the bottom surface of the interposer are in contact with a corresponding one of the plurality of first conductive bumps to provide a plurality of contacting pairs of first conductive bumps and second conductive bumps, and so that the bottom surface of the interposer is in contact with upper surfaces of the protrusions;
    performing a reflow process to merge each of the contacting pairs of the first conductive bumps and the second conductive bumps to form a plurality of conductive connection members, each conductive connection member extending between a corresponding first conductive pad on the upper surface of the first substrate and a corresponding second conductive pad on the bottom surface of the interposer;
    flowing an under-fill resin in a space between the interposer and the first substrate to surround and encapsulate the conductive connection members; and
    cutting the first substrate to form the semiconductor package, the semiconductor package including the first semiconductor chip and at least portions of the protrusions in contact with the interposer.

2. The method of claim 1, wherein the protrusions comprise a first protrusion extending along at least one of the sidewalls of the first semiconductor chip and a second protrusion which is cut when cutting the first substrate to have a side forming a portion of a side of the semiconductor package.

3. The method of claim 2, wherein with respect to a vertical cross section of the semiconductor package, the recess comprises a portion continuously extending between the first protrusion and the second protrusion.

4. The method of claim 3, wherein, with respect to the vertical cross section of the semiconductor package, a first conductive connection member is formed adjacent to the second protrusion and is horizontally spaced apart from the second protrusion no more than 50% of the maximum horizontal width of the first conductive connection member.

5. The method of claim 4, wherein, with respect to the vertical cross section of the semiconductor package, a second conductive connection member is formed adjacent to the first protrusion, there is no other conductive connection member positioned between the second conductive connection member and the first protrusion, and the second conductive connection member is horizontally spaced apart from the first protrusion by at least the maximum horizontal width of the second conductive connection member.

6. The method of claim 3, further comprising, after forming the mold layer to cover the first conductive bumps and prior to placing the interposer on the first substrate, providing a plurality of discrete holes in a bottom surface of the recess to expose the first conductive bumps.

7. The method of claim 6, wherein each conductive connection member is located within a corresponding hole and is spaced apart from sidewalls of the corresponding hole.

8. The method of claim 7, wherein, with respect to a top down view, each of the holes has a shape that conforms to the shape of the corresponding conductive connection member located therein.

9. The method of claim 8, wherein after providing the plurality of discrete holes and before performing a reflow process, sidewalls of at least one of the holes extend to a height greater than an uppermost surface of a first conductive bump formed therein.

10. The method of claim 1, wherein, from a top down perspective, the recess surrounds the first semiconductor chip.

11. The method of claim 1, wherein with respect to a vertical cross section, the protrusions comprise two first protrusions extending along opposite sidewalls of the first semiconductor chip and two second protrusions formed at opposite sides of the semiconductor package.

12. The method of claim 11, wherein, with respect to the vertical cross section, each of the second protrusions is vertically spaced apart from a corresponding conductive connection member no more than 50% of the maximum horizontal width of the corresponding conductive connection member.

13. The method of claim 1,
wherein one of the protrusions includes a first portion having a horizontal width extending in a first direction and a second portion having a horizontal width extending in a second direction perpendicular to the first direction, and
wherein the first portion and the second portion of the one protrusion merge at a corner of the semiconductor package.

14. The method of claim 13, wherein outer facing sidewalls of the first portion and the second portion of the one protrusion form portions of corresponding sides of the semiconductor package.

15. The method of claim 14, wherein, with respect to a top-down view, the one protrusion has an "L" shape having an interior angle formed by inner facing sidewalls of the first and second portions respectively opposite the outer facing sidewalls of the first and second portions.

16. The method of claim 15, wherein, with respect to the top-down view, the conductive connection members are regularly spaced apart in a two-dimensional array with a boundary of the array including a corner located adjacent the interior angle of the "L" shaped one protrusion.

17. The method of claim 16, wherein the boundary of the array is spaced apart from the inner facing sidewall of the first portion of the one protrusion the same distance as the boundary of the array is spaced apart from the inner facing sidewall of the second portion of the one protrusion.

18. The method of claim 15, wherein, with respect to the top-down view, the inner facing sidewalls each include one or more concave portions, wherein each concave portion is positioned adjacent a corresponding conductive connection member.

19. The method of claim 18, wherein, with respect to the top-down view, each concave portion is spaced apart from a corresponding conductive connection member to provide a space that is conformally formed about the corresponding conductive connection member.

20. The method of claim 15, wherein, with respect to the top-down view, each of the inner facing sidewalls have a wave shaped profile.

* * * * *